(12) United States Patent
Saito et al.

(10) Patent No.: US 9,960,591 B2
(45) Date of Patent: May 1, 2018

(54) INVERTER CONTROL DEVICE (71) Applicant: HITACHI AUTOMOTIVE SYSTEMS, LTD., Hitachinaka-shi, Ibaraki (JP)

(72) Inventors: Hiroyuki Saito, Isesaki (JP); Haruhiko Fujita, Machida (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days. days.

(21) Appl. No.: 15/525,443

(22) PCT Filed: Sep. 9, 2015

(86) PCT No.: PCT/JP2015/075537
§ 371 (c)(1),
(2) Date: May 9, 2017

(87) PCT Pub. No.: WO2016/080057
PCT Pub. Date: May 26, 2016

(65) Prior Publication Data
US 2017/0373488 A1 Dec. 28, 2017

(30) Foreign Application Priority Data

Nov. 19, 2014 (JP) ................. 2014-234106

(51) Int. Cl.
| H02H 7/12 | (2006.01) |
|---|---|
| H02H 7/122 | (2006.01) |
| H02M 7/5387 | (2007.01) |
| H02P 27/06 | (2006.01) |

(52) U.S. Cl.
CPC ........ *H02H 7/1222* (2013.01); *H02M 7/5387* (2013.01); *H02P 27/06* (2013.01)

(58) Field of Classification Search
CPC ..... H02H 7/1222; H02M 7/5387; H02P 27/06
See application file for complete search history.

(56) References Cited

U.S. PATENT DOCUMENTS

| 2005/0174820 A1* | 8/2005 | Mutoh | H02M 1/44 363/144 |
|---|---|---|---|
| 2012/0175948 A1* | 7/2012 | Kamijo | B60L 3/003 307/9.1 |

FOREIGN PATENT DOCUMENTS

| JP | 52-045038 A | 4/1977 |
|---|---|---|
| JP | 62-221876 A | 9/1987 |
| JP | 02-262828 A | 10/1990 |

(Continued)

*Primary Examiner* — Zeev V Kitov
(74) *Attorney, Agent, or Firm* — Foley & Lardner LLP (57) ABSTRACT

In a multilayer printed circuit board (circuit board 20) having an inverter (switching elements 22) mounted thereto, only a second wiring pattern P2 arranged downstream of a semiconductor relays 24 and able to shut off an electric power supply and a third wiring pattern P3 arranged upstream of a shunt resistor 27 and able to detect an overcurrent are placed in adjacent layers in a manner to face each other, and thus, even if the mutually facing portions (laminated portion) of the these two wiring patterns P2 and P3 are subjected to short circuit, an overcurrent caused by the short circuit can be detected by the shunt resistor 27 and the electric power supply to the switching elements 22 can be shut off by the switching elements 22, so that overheating at the second and third wiring patterns P2 and P3 can be avoided.

2 Claims, 12 Drawing Sheets (56) References Cited

FOREIGN PATENT DOCUMENTS

| JP | 406268370 | * | 3/1993 | ............... H05K 3/46 |
| JP | 2000-102253 A | | 4/2000 | |
| JP | 2004-187484 A | | 7/2004 | |

* cited by examiner

INVERTER CONTROL DEVICE

TECHNICAL FIELD

The present invention relates to an inverter control device that comprises a multilayer printed circuit board of laminated structure and an inverter mounted to the circuit board.

BACKGROUND ART

As a conventional inverter control device, the device described in an after-mentioned Patent Document-1 is known as an example.

That is, in the known inverter control device, wiring between an inverter and a condenser is made by laminated bus bars or the like that extend in parallel and approach each other to reduce an area occupied by the wiring and a ground line, so that the inverter control device as a whole can be reduced in size.

PRIOR ART DOCUMENT

Patent Document

Patent Document-1: Japanese Laid-open Patent Application (tokkai) 2004-187484

SUMMARY OF INVENTION

Problems to be Solved by Invention

However, in the above-mentioned known inverter control device, protection of the device at the time of short circuit of the laminated bus bars has been given little thought, and thus, when the arrangement of the above-mentioned wiring with the laminated bus bars is practically applied to a printed circuit board, there is a possibility that short circuit of the laminated bus bar portions causes a problem of overheating.

The present invention is provided by taking the above-mentioned technical problem into consideration and aims to provide an inverter control device that comprises a multilayer printed circuit board and an inverter mounted to the circuit board in which overheating that would be caused by short circuit of laminated portions of the multilayer printed circuit board can be suppressed.

Means for Solving Problem

According to the present invention, there is provided an inverter control device that comprises a multilayer printed circuit board and an inverter mounted to the circuit board, in which at least one wiring part of an electric power line arranged at a downstream side of a power shutting means and at least one wiring part of a ground line arranged at an upstream side of an overcurrent detecting means are placed to face each other in adjacent layers spaced apart in a laminating direction of the multilayer printed circuit board.

In addition to the above arrangement, the inverter control device may employ such an arrangement that at least one part of the wiring of an electric power line arranged at a downstream side of an overcurrent detecting means and at least one part of wiring of a ground line arranged at a downstream side of an inverter are placed to face each other in adjacent layers spaced part in a laminating direction of the multilayer printed circuit board.

Effects of Invention

In accordance with the present invention, at least one part of wiring of an electric power line arranged at a downstream side of an electric power shutting means and at least one part of a ground line arranged at an upstream side of an overcurrent detecting means are so arranged as to be able to detect an overcurrent produced at an inverter and shut off an electric power supply, so that occurrence of overheating at the mutually facing parts (laminated portion) of the wirings can be avoided.

EMBODIMENT OF INVENTION

In the following, embodiments of the inverter control device according to the present invention will be described in detail with reference to the accompanying drawings. The following description on the embodiments is directed to a motor control device of an electric brake booster device mounted to a motor vehicle, to which the inverter control device of the invention is practically applied.

Figure 1:
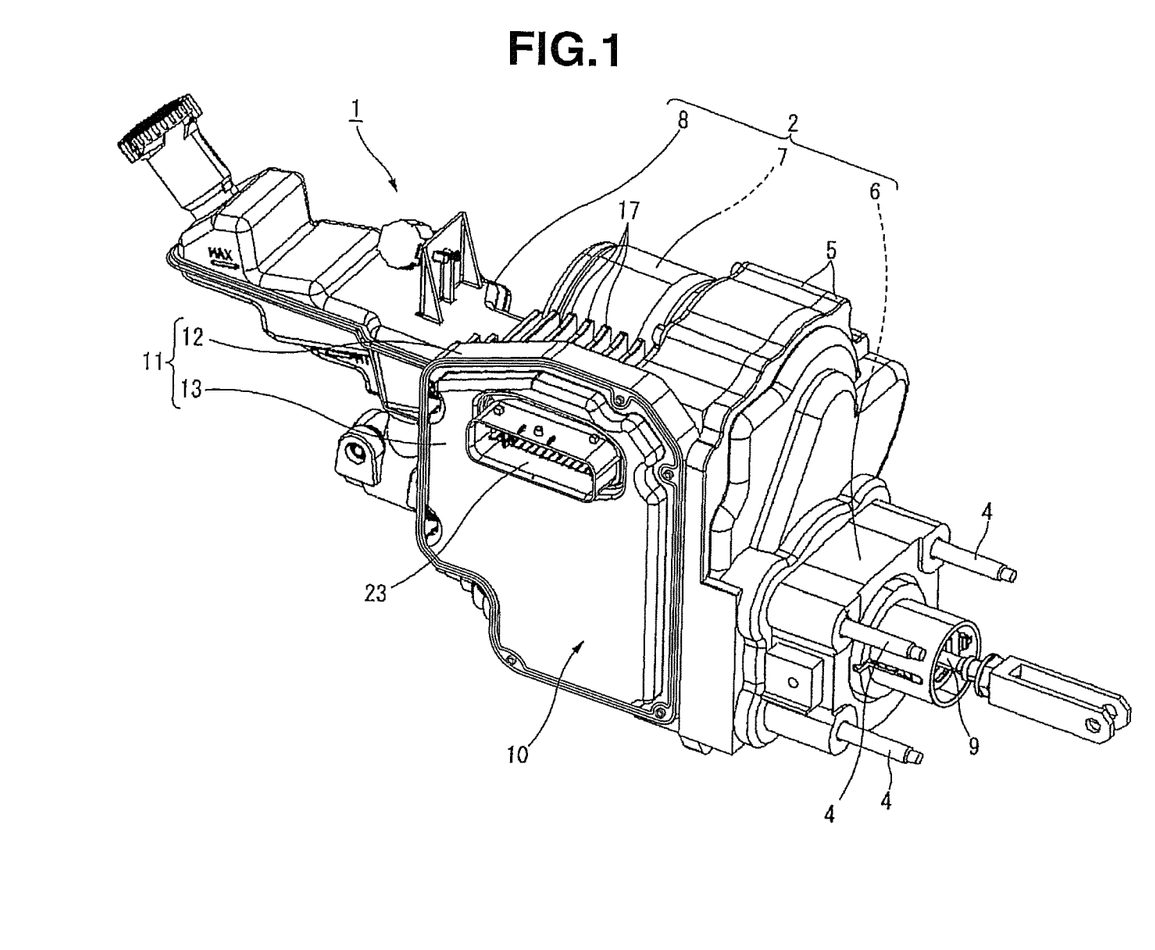
FIG. 1 is a perspective view of a brake device for a vehicle, to which an inverter control device of the present invention is applied.
Figure 2:
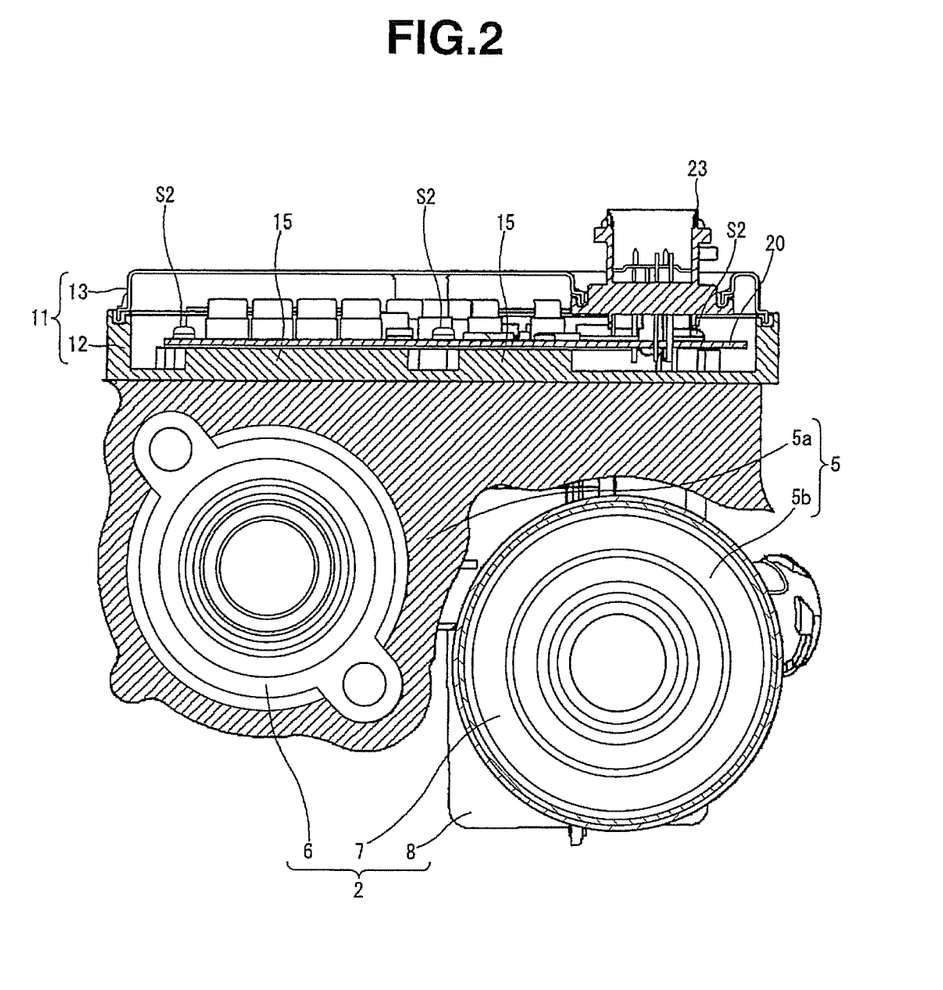
FIG. 2 is a vertical cross sectional view of the brake device shown in FIG. 1.

FIGS. 1 to 11 are drawings showing a first embodiment of an inverter control device according to the present invention, in which FIG. 1 is a perspective view of an entire construction of a brake booster device 1 to which a motor control device 10 corresponding to the inverter control device of the present invention is applied, and FIG. 2 is a vertical cross sectional view of the brake booster device 1.

As is seen from FIGS. 1 and 2, the brake booster device 1 is driven by a three-phase AC power and comprises mainly an electric actuator unit 2 that carries out a hydraulic pressure control of brake fluid and a motor control device 10 that drives and controls an after-mentioned electric motor 7, which constitutes part of the electric actuator unit 2, in accordance with a brake operation by a driver and a vehicle operation condition, and the brake booster device 1 is mounted to a dash panel (not shown) through a plurality of stud bolts 4 projected from a rear end portion of the electric actuator unit 2.

The electric actuator unit 2 comprises a master cylinder 6 as a hydraulic pressure generating means that generates a brake fluid pressure in accordance with an axial movement of a piston member (not shown) that is axially movably received in a cylinder receiving part 5a of an actuator housing 5, an electric motor 7 that is installed in a motor receiving part 5b provided in the cylinder receiving part 5a of the actuator housing 5 and provides the above-mentioned piston member with a moving power, a power transmission means (not shown) that transmits the output power of the electric motor 7 to the piston member while converting the rotational output power of the motor to a linearly moving force and a reservoir tank 8 that reserves therein the brake fluid generating the brake fluid pressure.

The brake booster device 1 having the above-mentioned construction is so operated that when, upon a brake operation by a driver, a push rod 9 coaxially extending along the above-mentioned piston through a brake pedal (not shown) is pressed in an axial direction, the electric motor 7 is driven and controlled based on an exciting current applied thereto from the motor control device 10 in accordance with a stroke amount of the push rod 9 and a vehicle operation condition, so that the hydraulic pressure of the brake fluid is controlled.

Figure 3:
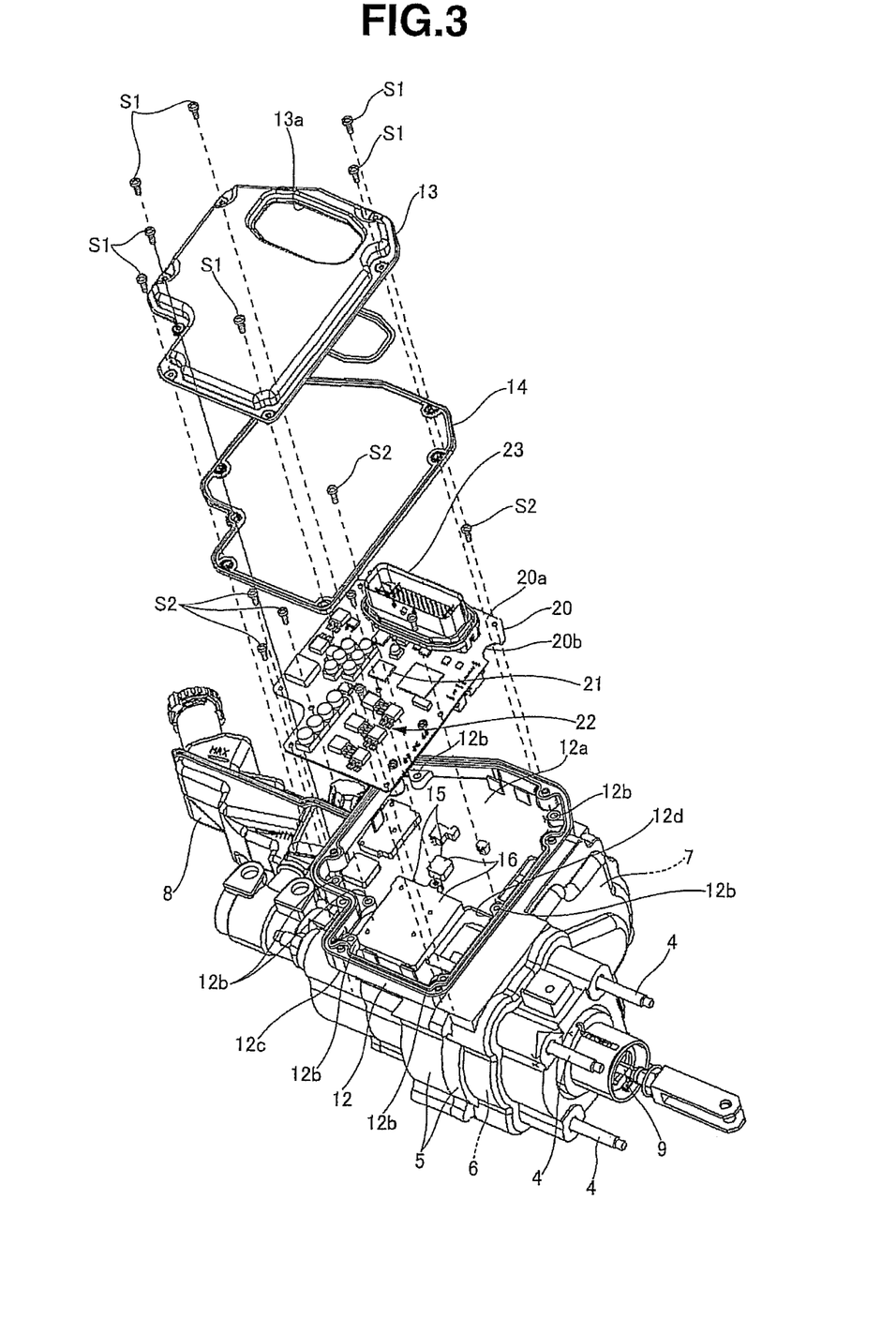
FIG. 3 is an exploded and perspective view of the inverter control device shown in FIG. 1.
Figure 4:
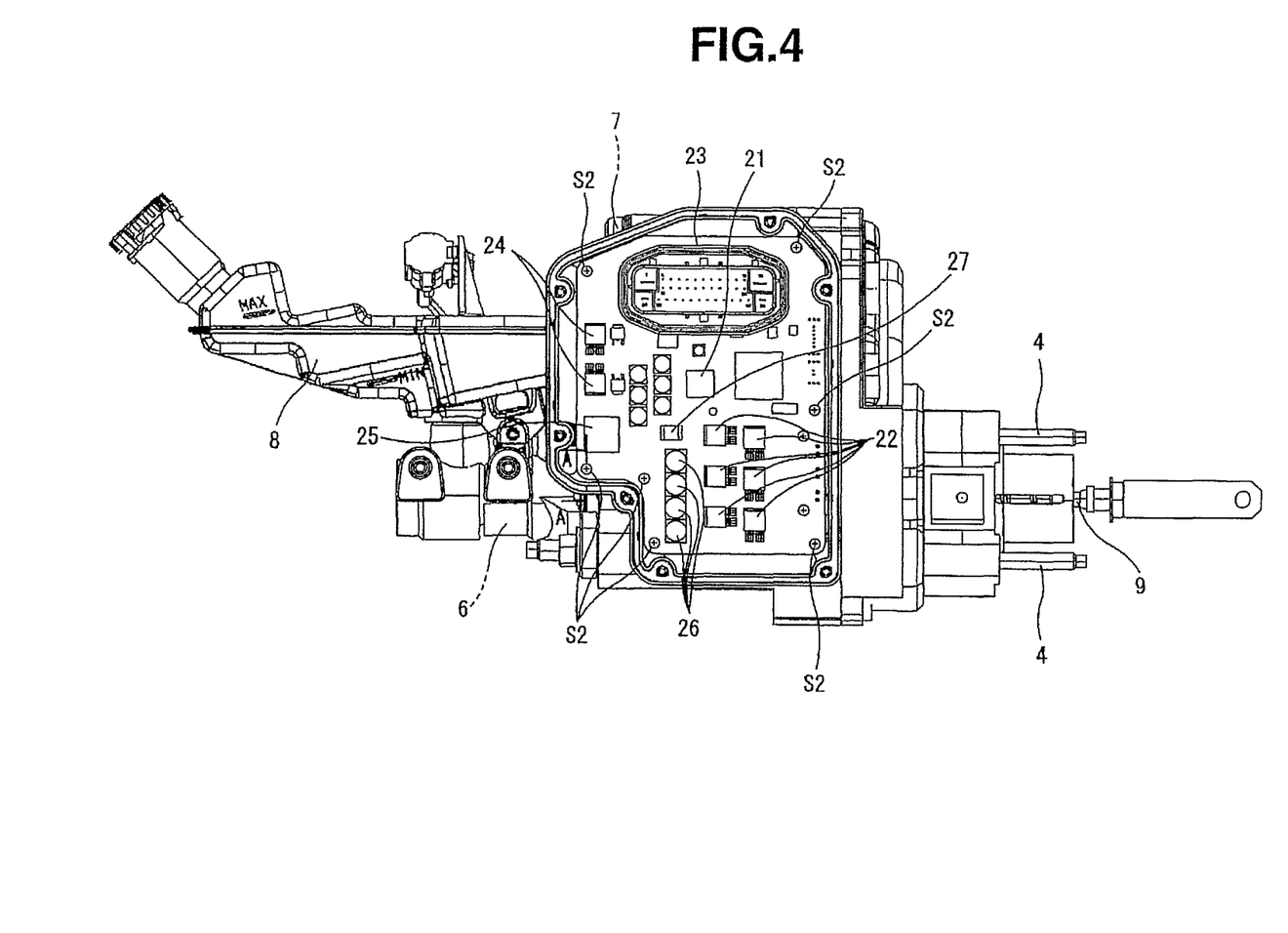
FIG. 4 is a front view of the inverter control device of FIG. 1 with a cover removed.

FIG. 3 is an exploded and perspective view of the motor control device 10, and FIG. 4 is a front view of the motor control device with a cover 13 removed.

As is seen from FIGS. 3 and 4, the motor control device 10 has such a construction that within an ECU housing 11 a bottom wall 12a of which is partly integral with the actuator housing 5, there is installed a flat circuit board 20 that puts thereon various electronic parts such as a microcomputer 21 for calculating a drive operation amount of the electric motor 7, a plurality of switching elements 22 as inverters for driving the electric motor 7 and the like.

The ECU housing 11 comprises a bottomed prismatic metal case 12 that is integrally molded with the actuator housing 5 and has an open portion opened to a side of the actuator housing 5 and a metal cover 13 that, serving as a generally flat cover member, covers the open portion of the case 12. The cover 13 is fixed to the case 12 by means of a plurality of screws S1, and to a connected portion between the case 12 and the cover 13, there is applied a known sealing member 14 that is a liquid packing. It is to be noted that the case 12 is produced through a so-called aluminum die casting method, and the cover 13 is produced by applying a press forming to a metal plate.

On a bottom wall surface of the case 12, there are formed block like rectangular heat radiation stands 15 at positions facing to a mounting area A1 of the microcomputer 21 and a mounting area A2 of the above-mentioned switching elements 22 respectively, so that the heat radiation stands effect a heat radiation of the electronic parts 21 and 22. On each of the heat radiation stands 15, there is arranged a heat conductive member 16. Upon assembly, the mounting areas A1 and A2 (see FIG. 6) of the above-mentioned circuit board 20 (back side 20b) are brought into contact with the heat conductive members 16, so that heat generated by the electronic parts 21 and 22 can be radiated or transferred to the case 12 and the actuator housing 5 integral with the case 12.

It is to be noted that an outer surface 12c of the case 12 is formed with a plurality of heat radiation fins 17 through which the heat radiation is effectively made. It is to be noted that the heat radiation may be so made that the switching elements 22 are directly contacted to the heat radiation stands 15 without usage of the heat conductive members 16. As the heat conductive member 16, a liquid grease is usable in addition to an elastic sheet member made of silicone or the like. Furthermore, it is desirable that the heat conductive member 16 has a dielectric property.

Figure 5:
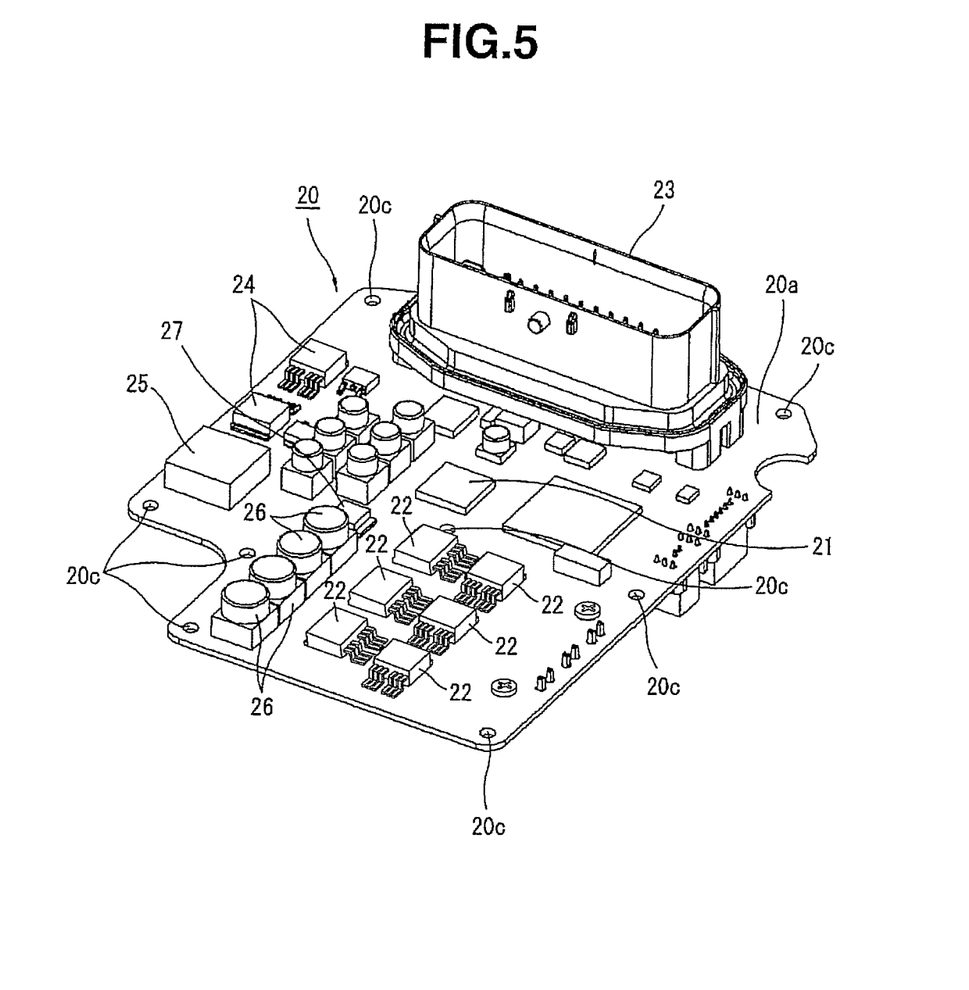
FIG. 5 is a perspective view of a circuit board unit shown in FIG. 3, that is viewed from a front surface side of the unit.
Figure 6:
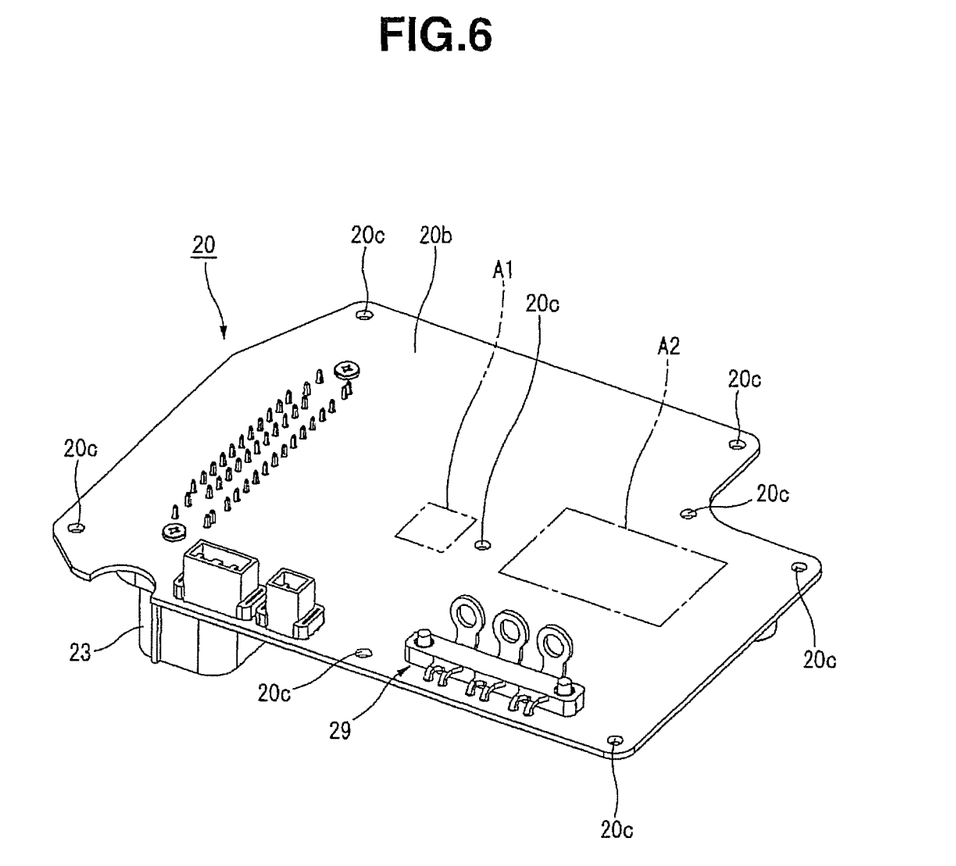
FIG. 6 is a perspective view of the circuit board unit of FIG. 3, that is viewed from a back surface side of the unit.

FIG. 5 is a perspective view of the circuit board 20 that is viewed from an upper surface 20a (cover 13 side), and FIG. 6 is a perspective view of the circuit board 20 that is viewed from a lower surface 20b (the bottom wall 12a side of the case 12).

The circuit board 20 is a so-called multilayer printed circuit board (four layers in the embodiment), and as is seen from FIGS. 5 and 6, the circuit board 20 has such a construction that a basal plate made of non-conducting resin material represented by glass epoxy resin has on its upper and lower surfaces thereof and/or therein a plurality of conductor patterns, viz., first to fourth wiring patterns P1 to P4 (see FIG. 8 to FIG. 11) that are layered and arranged each to constitute an inverter circuit, and the circuit board is received in and secured to the case 12 by means of a plurality of screws S2 that pass through connection holes 20c formed in a peripheral portion and a center portion of the circuit board to be screwed to securing portions 12b formed on the case 12.

As is seen from FIG. 5, to one end portion of the upper surface 20a that constitutes a part mounting surface of the above-mentioned circuit board 20, there is mounted a connector 23 that takes part in transmitting or receiving signals and electric power to an external electronic device (not shown), to a central portion of the upper surface 20a, there are mounted the microcomputer 21 and semiconductor relays 24 as current shutting means, and to the other end portion of the upper surface, there are mounted the switching elements 22. It is to be noted that the connector 23 is exposed to the outside through a connector receiving hole 13a formed in the cover 13. Designated by numeral 25 in FIG. 5 is a normal choke coil that functions as a noise filter part, designated by numeral 26 is a smoothing capacitor and designated by numeral 27 is a shunt resistor that serves as an overcurrent detecting means.

The shunt resistor 27 detects an overcurrent with reference to both the voltage at the side of the switching elements 22 arranged in the upstream side and the voltage at the ground side that is the downstream side. More specifically, each of the voltages is amplified by an amplifier circuit (not shown), and the overcurrent is detected by an overcurrent detection part 28 based on the amplified signal. The above-mentioned "upstream side and downstream side" are to be understood as referring to "upstream side and downstream side with respect to the direction in which a current flows", and basically, the side connected to a power source corresponds to the upstream side and the side connected to ground corresponds to the downstream side.

It is further to be noted that the overcurrent detection part 28 is constructed as one functional part possessed by the microcomputer 21. If desired, the overcurrent detection part 28 may be possessed by a calculation element other than the microcomputer 21 and if desired, not as the function of the single element, the overcurrent detection part may be constructed as a detection circuit arranged in the circuit board 20.

Thus, the circuit board 20 is constructed to have control circuit elements that include the microcomputer 21 for calculating the drive operation amount of the electric motor 7, drive circuit elements that include the plurality of switching elements 22 as inverters for driving the electric motor 7 and noise filter elements that include the normal choke coil 25 and the smoothing capacitor 26.

As is seen from FIG. 6, to the lower surface 20b of the circuit board 20, there is provided a motor connecting portion 29 that is electrically connected to the electric motor 7. This motor connecting portion 29 is so constructed as to establish the electric connection with the electric motor 7 by a wiring (not shown) that passes through a through opening 12d formed in the bottom wall 12a of the case 12. In FIG. 6, designed by A1 is the mounting area of the microcomputer 21 (viz., the area of the lower surface 20b that corresponds to the mounting area of the upper surface 20a to which the microcomputer 21 is actually mounted) and designated by A2 is the mounting area of the switching elements 22 (viz., the area of the lower surface 20b that corresponds to the mounting area of the upper surface 20a to which the switching elements 22 are actually mounted). As is mentioned hereinabove, the mounting areas A1 and A2 are contacted to the heat radiation stands 15 through the heat conductive members 16, and thus, heat generated by the microcomputer 21, the switching elements 22 and neighboring parts is transferred to heat radiation stands 15 and finally the heat is radiated to the outside from the case 12, or the heat is transferred from the case 12 to the actuator housing 5, and finally the heat is radiated to the outside from the actuator housing 5.

Figure 7:
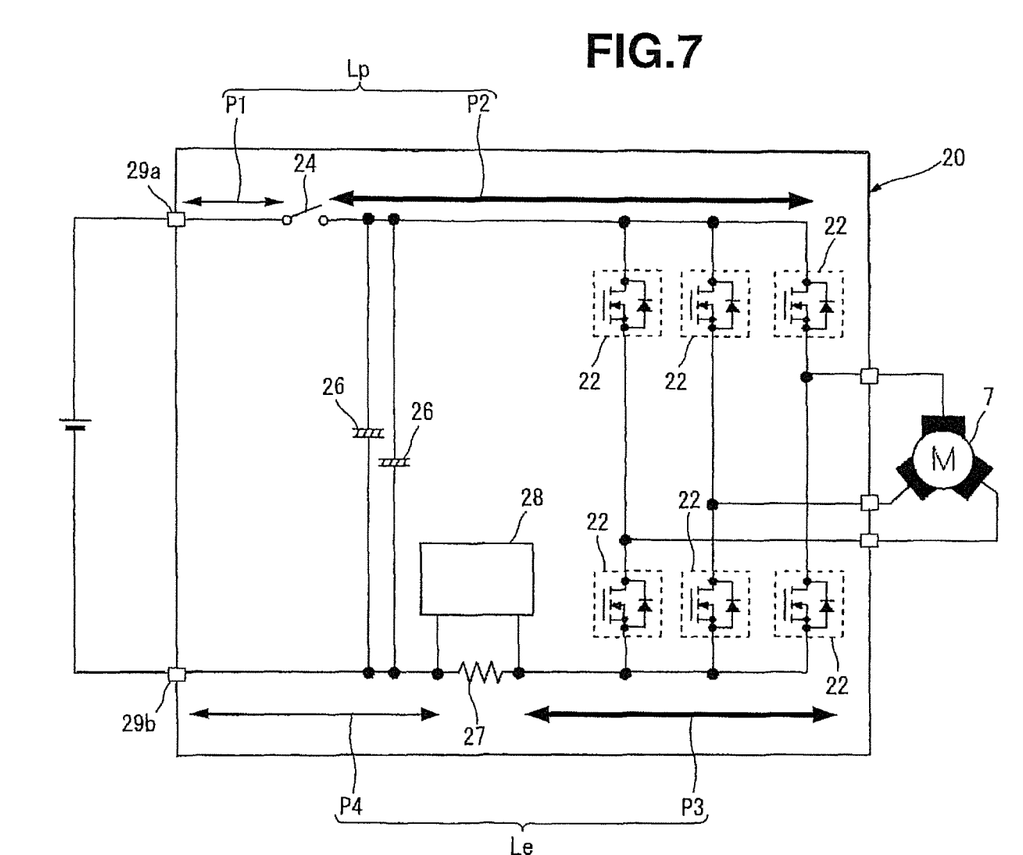
FIG. 7 is a schematic view of a circuit configuration employed in a first embodiment of the present invention.
Figure 8:
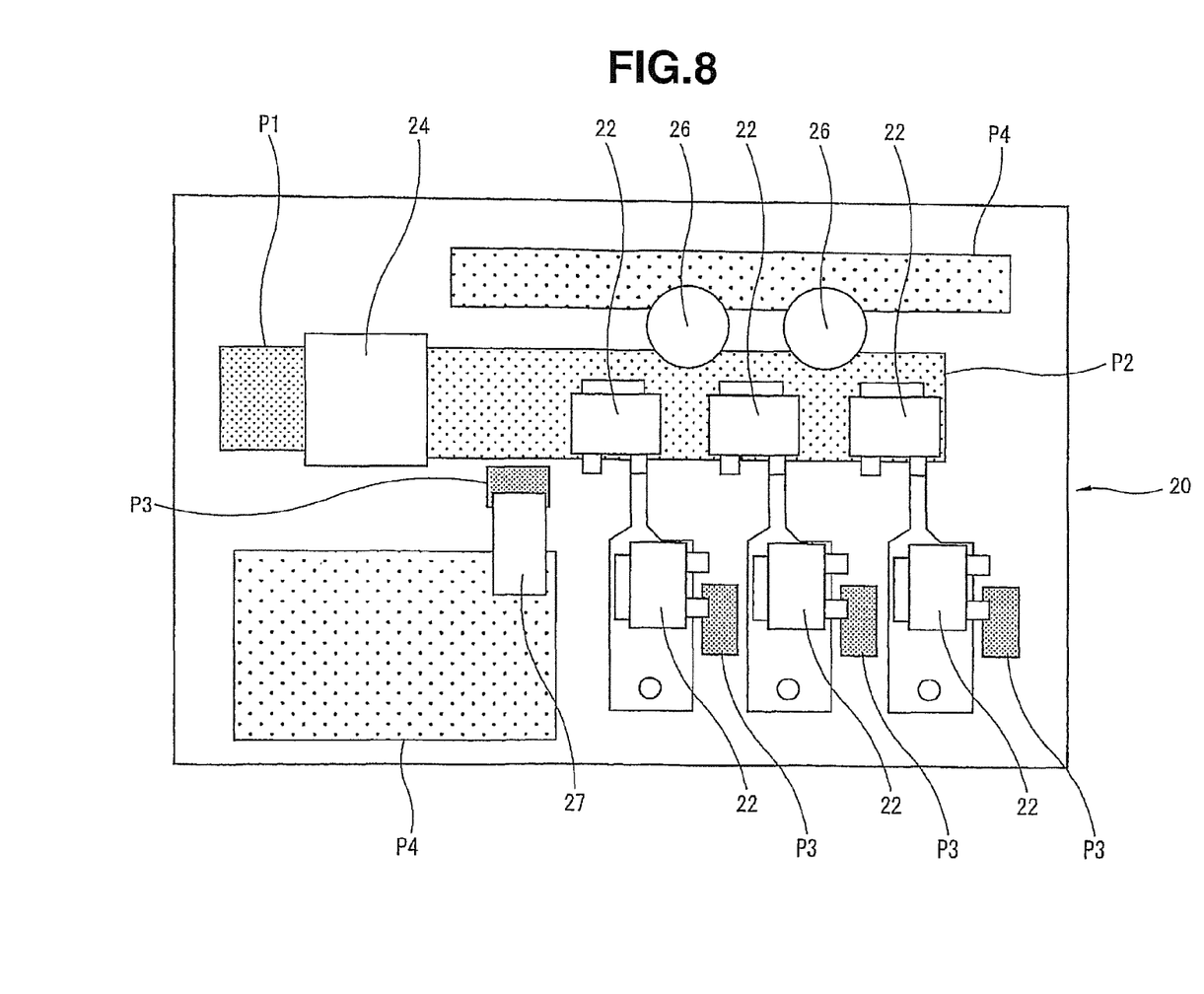
FIG. 8 is a plan view of a wiring pattern of a first layer of the circuit board of FIG. 5 employed in the first embodiment.
Figure 9:
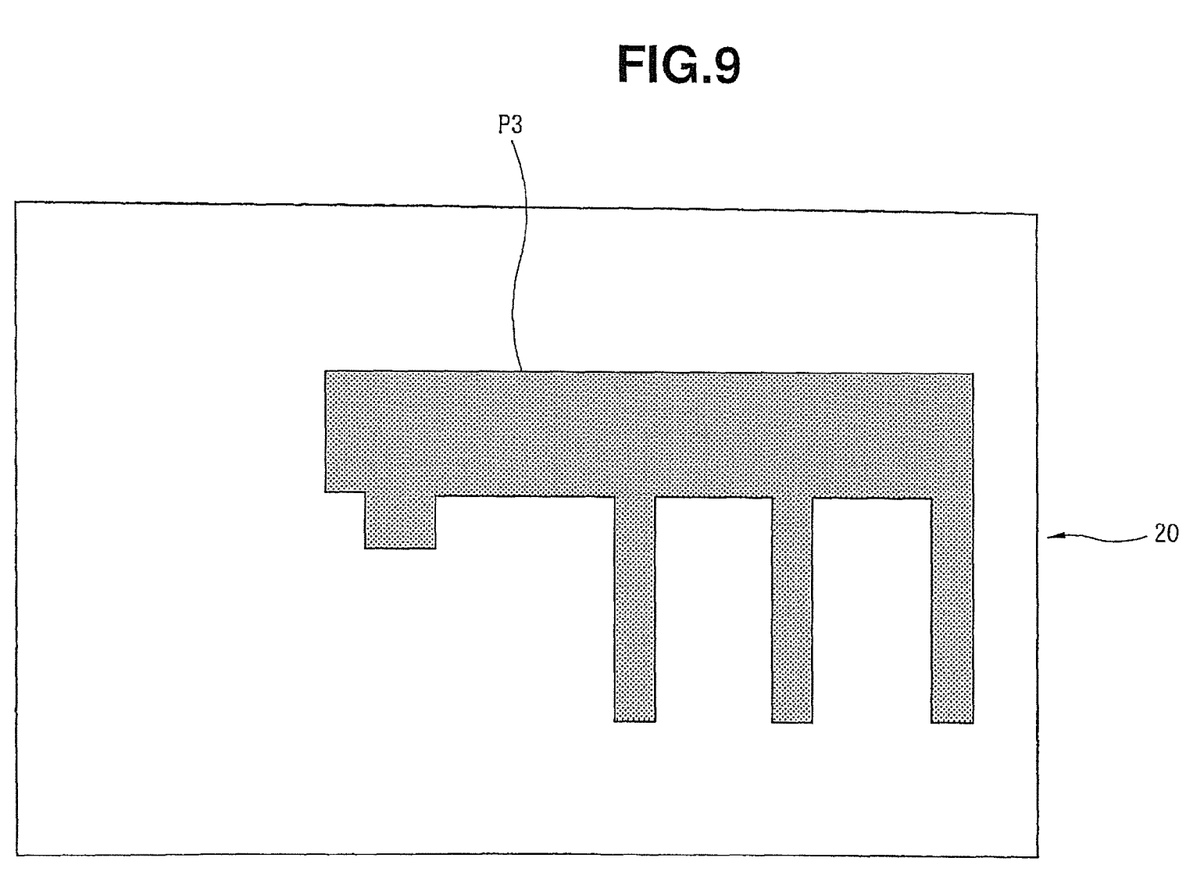
FIG. 9 is a plan view of a wiring pattern of a second layer of the circuit board of FIG. 5 employed in the first embodiment.
Figure 10:
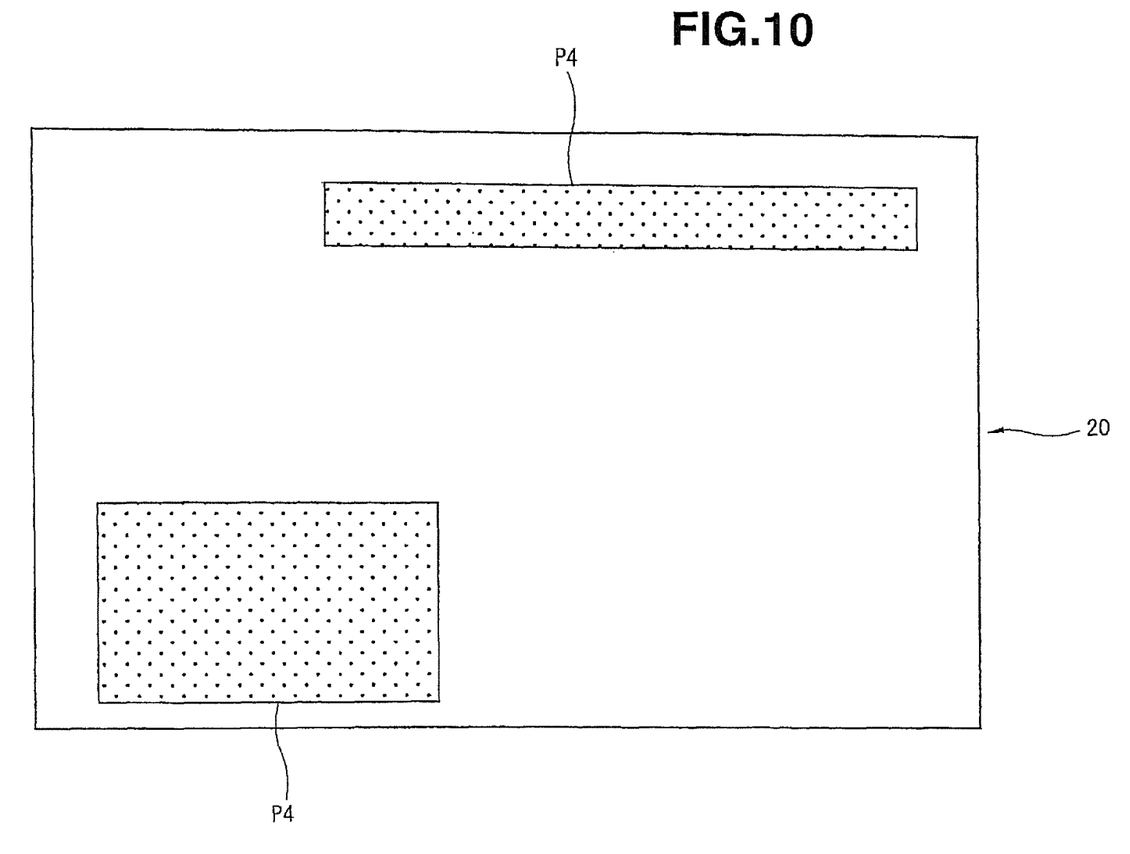
FIG. 10 is a plan view of a wiring pattern of a third layer of the circuit board of FIG. 5 employed in the first embodiment.
Figure 11:
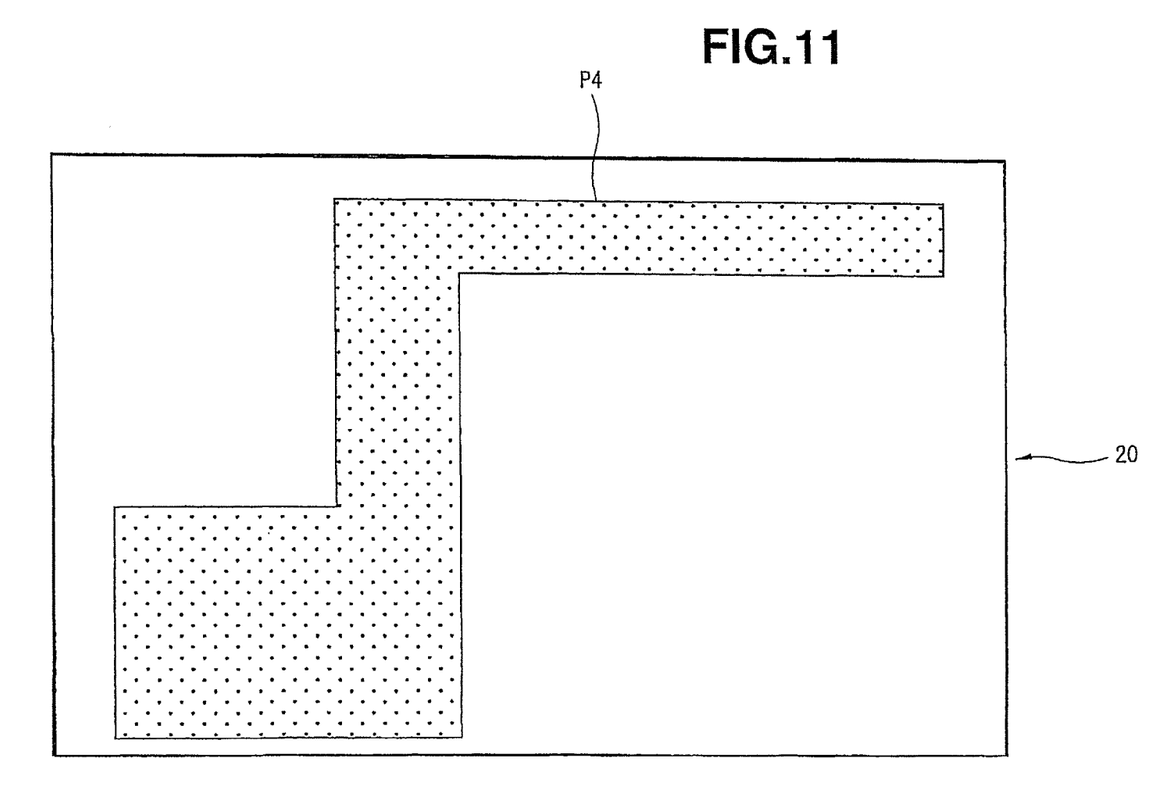
FIG. 11 is a plan view of a wiring pattern of a fourth layer of the circuit board of FIG. 5 employed in the first embodiment.

FIG. 7 is a schematic view of a circuit configuration employed by the circuit board 20. It is to be noted that wiring patterns (P2, P3) indicated by thicker arrows in the drawing show a laminated portion where mutually different wiring layers (neighboring layers) are arranged to oppose or face each other, and the other wiring patterns (P1, P4) indicated by thinner arrows in the drawing show a non-laminated portion where the wiring layers in the neighboring layers are arranged not to oppose or face each other. FIG. 8 is a plan view of a first layer that shows a wiring pattern of the first layer (surface layer) of the circuit board 20, FIG. 9 is a plan view of a second layer that shows a wiring pattern of the second layer of the circuit board 20, FIG. 10 is a plan view of a third layer that shows a wiring pattern of the third layer of the circuit board 20 and FIG. 4 is a plan view of a fourth layer than shows a wiring pattern of the fourth layer of the circuit board 20.

As is seen from FIGS. 7 and 8, in the circuit board 20, a power line Lp that carries out an electric power supply from a power terminal 29a to the switching elements 22 comprises the first wiring pattern P1 by which a power line section from the power terminal 29a to the semiconductor relays 24 is constituted and the second wiring pattern P2 by which a power line section from the semiconductor relays 24 to the switching elements 22 is constituted, and a ground line Le from the switching elements 24 to a ground terminal 29b comprises the third wiring pattern P3 by which a ground line section from the switching elements 22 to the shunt resistor 27 is constituted and the fourth wiring pattern P4 by which a ground line section from the shunt resistor 27 to the ground terminal 29b is constituted.

In the circuit board 20 having the above-mentioned construction, as is seen from FIGS. 7 to 11, in the above-mentioned wiring patterns P1 to P4, the second wiring pattern P2 and the third wiring pattern P3 are respectively arranged in neighboring layers (viz., the first and second layers in the embodiment) in a laminating direction of the circuit board 20 in a manner to oppose or face each other through an insulating member (not shown), while, the first wiring pattern P1 and the fourth wiring pattern P4, the first wiring pattern P1 and the third wiring pattern P3 and the second wiring pattern P2 and the fourth wiring pattern P4 are respectively arranged in corresponding neighboring layers in the laminating direction of the circuit board 20 in a manner not to oppose or face each other.

As will be understood from the above description, in the circuit board 20 for the motor control device 10 of the first embodiment, the second wiring pattern P2 placed downstream of the semiconductor relays 24 and the third wiring pattern P3 placed upstream of the shunt resistor 27 are arranged in the adjacent layers in a manner to oppose or face each other, and thus, even if mutually opposed portions (laminate portions) of these wiring patterns P2 and P3 are subjected to short circuit, an overcurrent thus produced can be detected by the shunt resistor 27 to cause the semiconductor relays 24 to stop an electric power feeding to the second and third wiring patterns P2 and P3 as well as to the switching elements 22, so that overheating at the second wiring pattern P2 and the third wiring pattern P3 can be suppressed or avoided.

While, at both the first wiring pattern P1 that corresponds to a range where the power shutting can't be obtained because the range is placed upstream of the semiconductor relays 24 and the fourth wiring pattern P4 that corresponds to a range where the overcurrent can't be detected because the range is placed downstream of the shunt resistor 27, the above-mentioned non-opposed arrangement against other wiring patterns can suppress or avoid the overheating at these first and fourth wiring patterns P1 and P4 if the above-mentioned short circuit takes place.

As is mentioned hereinabove, in the circuit board 20 that is a multilayer printed circuit board to which the various switching elements 22 are mounted, it is possible to employ a laminated construction that is able to suppress or avoid an overheating that would be caused by short circuit between the mutually opposed adjacent portions, and thus, miniaturization of the motor control device 10 is achieved.

Furthermore, due to employment of the laminated construction, noise reduction is expected by such laminated construction.

Figure 12:
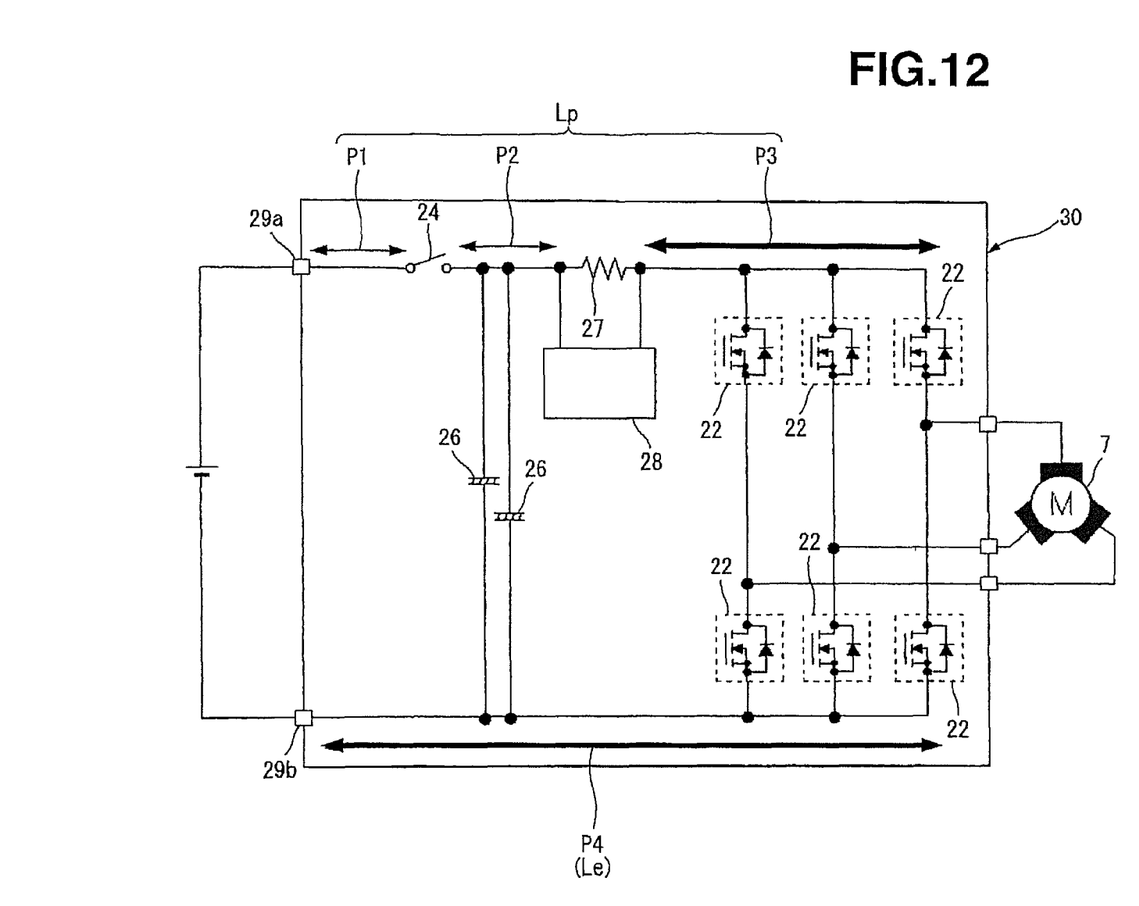
FIG. 12 is a schematic view of a circuit configuration employed in a second embodiment of the present invention.

FIG. 12 shows a second embodiment of the inverter control device of the present invention, that employs a circuit board 30 which is different from the circuit board 20 of the first embodiment in the arrangement of mounting parts and the construction of wiring patterns. Like in case of FIG. 7, the wiring patterns (P2, P3) indicated by thicker arrows in the drawing show a laminated portion where mutually different wiring layers are arranged to oppose or face each other, and the other wiring patterns (P1, P4) indicated by thinner arrows in the drawing show a non-laminated portion where the wiring layers in the neighboring layers are arranged not to oppose or face each other. In the following, description will be directed to only constructional portions that are different from those of the above-mentioned first embodiment, and constructional portions that are the same as those of the first embodiment will be denoted by the same reference numerals while omitting a detailed description on the same constructional portions.

In the circuit board 30 of this second embodiment, the shut resistor 27 serving as the overcurrent detecting means is arranged at the power line Lp, and the power line Lp comprises a first wiring pattern P1 by which a power line section from the power terminal 29a to the semiconductor relays 24 is constituted, a second wiring pattern P2 by which a power line section from the semiconductor relays 24 to the shunt resistor 27 is constituted, a third wiring pattern P3 by which a power line section from the shunt resistor 27 to the switching elements 22 is constituted, and a ground line Le from the switching elements 22 to the ground terminal 29b comprises a fourth wiring pattern P4.

As is seen in the same drawing, in the circuit board 30, in the above-mentioned wring patterns P1 to P4, the third wiring pattern P3 and the fourth wiring pattern P4 are respectively arranged in neighboring layers in a laminating direction of the circuit board 30 in a manner to oppose or face each other through an insulating member (not shown), while, the first wiring pattern P1 and the fourth wiring pattern P4, and the second wiring pattern P2 and the fourth wiring pattern P4 are respectively arranged in corresponding neighboring layers in the laminating direction of the circuit board 30 in a manner not to oppose or face each other.

As will be understood from the above, in the motor control device 10 (circuit board 30) of the second embodiment, the third and fourth wiring patterns P3 and P4, which correspond to a range downstream of the shunt resistor 27 where an overcurrent produced at the third and fourth wiring patterns P3 and P4 is detected to stop the electric power supply, are arranged in the adjacent layers in a manner to oppose or face each other, and thus, even if the opposed portions (laminate portions) of these two wiring patterns P3 and P4 are subjected to short circuit, it is possible that the overcurrent produced at the third and fourth wiring patterns P3 and P4 is detected by the shunt resistor 27 and the electric power supply to the switching elements 22 is stopped by the semiconductor relays 24.

While, in the first wiring pattern P1 that corresponds to a range upstream of the semiconductor relays 24 where the shutting of the electric power supply can't be made and in the second wiring pattern P2 that corresponds to a range upstream of the shunt resistor 27 where the detection of the overcurrent can't be mad, occurrence of the overheating due to short circuit at the first and second wiring patterns P1 and P2 can be suppressed or avoided due to the non-opposed arrangement against the other wiring patterns.

As is described hereinabove, also in the motor control device 10 (circuit board 30) of this second embodiment, like in the above-mentioned first embodiment, in a multilayer printed circuit board to which the switching elements 22 are mounted, it is possible to employ a laminated construction that is able to suppress or avoid an overheating that would be caused by short circuit between mutually opposed adjacent portions, and thus, miniaturization of the motor control device 10 is achieved.

Furthermore, due to employment of the laminated construction, noise reduction is expected by such laminated construction.

The present invention is not limited to the above-mentioned constructions of the embodiments. That is, the number of lamination of the circuit boards 20 and 30 and the number and arrangement of the wiring patterns of the electronic parts mounted to the circuit boards 20 and 30 can be freely changed or varied in accordance with the specification of the motor control device 10 within a scope of the present invention.

Furthermore, regarding the adjacent opposed arrangement (lamination), the arrangement in which like in the first embodiment the downstream side of the semiconductor relays 14 and the upstream side of the shunt resistor 27 are arranged to oppose or race each other is not entirely needed. That is, even when only limited portions of the downstream and upstream sides are arranged to oppose or face each other, the overheating that would be caused by short circuit at the laminated construction can be avoided, which is a special operation effect of the present invention. Also in the second embodiment, as is described hereinabove as an example, it is not necessary to cause the downstream side of the shunt resistor 27 and the downstream side of the switching elements 22 to entirely oppose or face each other. That is, even when only limited portions of the downstream side and the other downstream side are arranged to oppose or face each other, the overheating that would be caused by short circuit at the laminated construction can be avoided, which is a special operation effect of the present is invention.

The invention claimed is:

1. An inverter control device having a multilayer printed circuit board and an inverter mounted to the circuit board, comprising:
an electric power shutting means arranged in an electric power line to shut off an electric power supply to the inverter; and
an overcurrent detecting means arranged in a ground line to detect an overcurrent of the inverter,
wherein at least one wiring part of the electric power line arranged downstream of the electric power shutting means and at least one wiring part of the ground line arranged upstream of the overcurrent detecting means are placed to face each other in adjacent layers spaced apart in a laminating direction of the multilayer printed circuit board, and
wherein a wiring of the electric power line arranged upstream of the electric power shutting means and a wiring of the ground line arranged downstream of the overcurrent detecting means are placed not to face each other in adjacent layers spaced apart in the laminating direction of the multilayer printed circuit board.

2. An inverter control device having a multilayer printed circuit board and an inverter mounted to the circuit board, comprising:
an electric power shutting means arranged in an electric power line to shut off an electric power supply to the inverter; and
an overcurrent detecting means arranged in a ground line to detect an overcurrent of the inverter,
wherein at least one wiring part of the electric power line arranged downstream of the electric power shutting means and at least one wiring part of the ground line arranged downstream of the inverter are placed to face each other in adjacent layers spaced apart in a laminating direction of the multilayer printed circuit board, and
wherein a wiring of the electric power line arranged upstream of the overcurrent detecting means and a wiring of the ground line arranged downstream of the inverter are placed not to face each other in adjacent layers spaced apart in the laminating direction of the multilayer printed circuit board.

* * * * *